US006440762B1

(12) United States Patent
Zhang

(10) Patent No.: US 6,440,762 B1
(45) **Date of Patent: *Aug. 27, 2002**

(54) LOW TEMPERATURE PROCESS FOR SHARPENING TAPERED SILICON STRUCTURES

(75) Inventor: Tianhong Zhang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 153 days.

This patent is subject to a terminal disclaimer.

(21) Appl. No.: 09/645,700

(22) Filed: Aug. 24, 2000

Related U.S. Application Data

(62) Division of application No. 09/235,652, filed on Jan. 22, 1999, which is a division of application No. 09/166,864, filed on Oct. 6, 1998, now Pat. No. 6,165,808.

(51) Int. Cl.$^{7}$ ................................................ H01L 21/00
(52) U.S. Cl. ........................................... 438/20; 445/50
(58) Field of Search ............................. 438/20; 445/46, 445/49, 50, 51, 24

(56) References Cited

U.S. PATENT DOCUMENTS

| | | | | |
|---|---|---|---|---|
| 5,201,993 | A | 4/1993 | Marcus et al. | 216/11 |
| 5,302,238 | A | 4/1994 | Roe et al. | 216/11 |
| 5,329,207 | A | 7/1994 | Cathey et al. | 315/169.1 |
| 5,358,908 | A | 10/1994 | Reinberg et al. | 438/20 |
| 5,393,647 | A | 2/1995 | Neukermans et al. | 430/320 |
| 5,438,240 | A | 8/1995 | Cathey et al. | 315/169.1 |
| 5,620,832 | A | 4/1997 | Sung et al. | 430/311 |
| 5,627,427 | A | 5/1997 | Das et al. | 313/308 |
| 5,628,661 | A | 5/1997 | Kim et al. | 445/24 |
| 5,632,664 | A | 5/1997 | Scoggan et al. | 445/50 |
| 5,656,886 | A | 8/1997 | Westphal et al. | 313/395 |
| 5,704,820 | A | 1/1998 | Chandross et al. | 445/24 |
| 5,923,948 | A | 7/1999 | Cathey, Jr. | 438/20 |
| 6,022,256 | A | 2/2000 | Rolfson | 445/24 |

FOREIGN PATENT DOCUMENTS

JP 08162668 6/1996

OTHER PUBLICATIONS

Ohwaki, T., et al.; *Characterization of Silicon Native Oxide Formed in SC–1, $H_2O_2$ and Wet Ozone Processes*, Jpn. J. Appl. Phys. vol. 36 (1997) Pt. 1, No. 9A, pp. 5507–5513.
Ohmi, T., et al.; *Native Oxide Growth and Organic Impurity Removal on Si Surface with Ozone–Injected Ultrapure Water*, J. Electrochem. Soc., vol. 140, No. 3, Mar. 1993 © The Electrochemical Society, Inc., pp. 804–810.
Ohmi, T.; *Very High Quality Thin Gate Oxide Formation Technology*, J. Vac. Sci. Technol. A 13(3), May/Jun. 1995, pp. 1665–1670.
Wolf et al., Silicon Processing for the VLSI Era, vol. 1: Process Technology, Lattice Press (1986), p. 520.
Wolf & Tauber, Silicon Processing for the VLSI Era vol. 1: Process Technology, Lattice Press, pp. 209–210.

*Primary Examiner*—Michael J. Sherry
*Assistant Examiner*—Evan Pert
(74) *Attorney, Agent, or Firm*—TraskBritt

(57) ABSTRACT

A method of sharpening a tapered or pointed silicon structure, such as a silicon field emitter. The method includes oxidizing the silicon field emitter to form an oxide layer thereon and removing the oxide layer. Oxidizing occurs at a low temperature and forms a relatively thin (e.g., about 20 Å to about 40 Å) oxide layer on the silicon field emitter. The oxide layer may be removed by etching. The method may be employed to sharpen existing silicon structures or in fabricating tapered or pointed silicon structures. A silicon field emitter that has been sharpened or fabricated in accordance with the method is substantially free of crystalline defects and includes an emitter tip having a diameter as small as about 40 Å to about 20 Å or less.

28 Claims, 5 Drawing Sheets

LOW TEMPERATURE PROCESS FOR SHARPENING TAPERED SILICON STRUCTURES

CROSS REFERENCE TO RELATED APPLICATIONS

This application is a divisional of application Ser. No. 09/235,652, filed Jan. 22, 1999, pending which is a divisional of application Ser. No. 09/166,864, filed Oct. 6, 1998, now U.S. Pat. No. 6,165,808.

This invention was made with Government support under Contract No. MDT00010-95-42 awarded by the Advance Research Projects Agency (ARPA). The Government has certain rights in this invention.

BACKGROUND OF THE INVENTION

1. Field of the Invention

The present invention relates to a process of sharpening tapered silicon structures. Specifically, the present invention relates to a process that is useful for sharpening tapered silicon structures, such as field emitters, or field emission tips, on a substrate after circuit traces or other metal layers or structures have been formed on the substrate. The present invention also relates to a method of fabricating sharply pointed or tapered structures from substrates such as silicon wafer, silicon-on-insulator (SOI), silicon-on glass (SOG), and silicon-on-sapphire (SOS).

2. Background of Related Art

Tapered structures have long been employed as field emitters in electronic display devices. Due to the ever-improving electron emission characteristics of silicon field emitters, and since silicon field emitters are relatively inexpensive to fabricate, their use in electronic display devices is ever-increasing. The ability of silicon field emitters to emit electrons is partially dependent upon the sharpness of the tips, or apices, thereof. Sharply tipped field emitters require less energy than more bluntly tipped field emitters to achieve a desired degree of electron emission. Accordingly, the improvement of silicon field emitters is due, in part, to state of the art techniques for fabricating such structures, with which techniques field emitters of ever-increasing sharpness may be fabricated.

Conventional processes for fabricating silicon field emitters typically include a mask and etch of a substrate in order to define a silicon field emitter. The silicon field emitter may then be sharpened by thermal oxidation of an exposed surface of the silicon field emitter, which typically occurs at a temperature exceeding 900° C., and the subsequent removal of the oxide layer from the field emitter. Subsequently, associated structures may be fabricated on the substrate and assembled therewith in order to manufacture a field emission display device.

Many state of the art silicon field emitter fabrication processes, however, are somewhat undesirable in that some field emitter tips lack a desirable level of sharpness (i.e., are "blunt"), which typically increases the amount of voltage that is required in order for the field emitter to properly function.

The increased voltage requirements of blunt field emitters may cause them to fail to turn "on" or to "hardly turn 'on'". In order to function properly, field emitters that hardly turn "on" require a voltage that exceeds a desired, or "expecting", operating voltage range. In contrast, properly functioning field emitters, which typically include sharp tips, turn "on", and therefore function properly, when a voltage within the expecting voltage range is applied thereto. The failure of a field emitter to turn "on" within the expecting voltage range may result in the failure of a field emission display including such a field emitter. "Failed" field emission display devices are typically scrapped or discarded, which decreases product yield and results in increased production costs.

For the same reasons described above, the variable voltage requirements created by nonuniformities in the sharpness of the field emitters of a field emission display device may create brightness nonuniformities on a display screen that is illuminated thereby, even in devices which include silicon field emitters that turn "on" within the expecting voltage range. While sharper field emitters will brightly illuminate their corresponding areas of a display screen, areas of the display screen that are illuminated by blunter field emitters will be relatively dim. Thus, although a field emission display device which includes blunt field emitters may not fail production testing, sharpness nonuniformities may cause unacceptable brightness nonuniformities on a finished display screen.

Techniques for fabricating field emission displays with silicon emitters of substantially uniform sharpness typically include repetitive thermal oxidation of the exposed surface of the field emitters and the subsequent removal of the oxide layer from the field emitters. Due to the high temperatures that are typically utilized in such thermal oxidation processes, however, relatively thick oxide layers are formed on the field emitters. Thus, it may be difficult to control the sharpness of the tips of the field emitters.

An exemplary state of the art process for fabricating tapered silicon structures, such as silicon field emitters, is disclosed in U.S. Pat. No. 5,201,992 (the "'992 patent"), which issued to Robert B. Marcus et al. on Apr. 13, 1993. The process of the '992 patent includes defining protuberances by conventional mask and etch techniques and thermally oxidizing the exposed surface of each of the protuberances in a dry-oxygen environment at a temperature of between about 900° C. and 1050° C. The oxide layer is then removed from the protuberances by conventional etch techniques in order to define the tapered structures. Thermal oxidation may be repeated to enhance the sharpness of the apices of the tapered structures. Following sharpening of each of the tapered structures, the sharpness of the apices may subsequently be decreased by thermally oxidizing same in either a wet or dry oxygen environment at a temperature exceeding 1050° C.

While the process of the '992 patent fabricates tapered silicon structures with sharp apices, the process cannot be employed on finished structures which include tapered silicon structures, such as field emission display arrays including circuit traces or other metal structures thereon. Thus, the process of the '992 patent is not useful for reworking finished field emission display arrays in order to decrease failure rates thereof or otherwise improving such finished field emission display arrays.

Moreover, with reference to FIG. 1, the repeated thermal oxidation of silicon field emitters is somewhat undesirable from the standpoint that the typically high temperatures that are utilized in such oxidation processes may create crystalline defects, which are indicated by arrows, in the silicon field emitter, such as point, line (e.g., slip, straight dislocations, dislocation loops, etc.), area, volume, or other crystalline defects. These crystalline defects may also increase the voltage requirement of the silicon field emitter.

Many conventional thermal oxidation processes that are employed to fabricate tapered silicon structures are further undesirable from the standpoint that the oxide layers formed thereby are relatively thick (e.g., on the order of hundreds of angstroms). Thus, as such an oxide layer is subsequently removed from the silicon structure, it may be difficult to control the sharpness of the silicon structure. Such conventional thermal oxidation processes form thick oxide layers due, in part, to the small process windows of such processes. Many conventional thermal oxidation processes may also damage the substrate which underlies the sharpened silicon structure, such as the glass of silicon-onglass substrates that are typically employed in manufacturing displays that are larger than the currently available silicon wafers.

Conventionally, the failure rates of field emission display devices have been relatively high. Although field emitters of substantially uniform sharpness may be fabricated by some known processes, field emission display devices are typically not tested until after circuit traces and other metal structures associated therewith have been fabricated. Thus, conventional thermal oxidation processes cannot be employed to further sharpen silicon field emitters, as the high temperatures of such processes may damage any metal structures that have been fabricated on the substrate upon which the field emitters are located.

Thus, a process is needed for reworking failed and marginally functional silicon field emitters without introducing crystalline defects therein and without damaging the substrate or any circuitry associated with the silicon field emitters. A process for fabricating sharply pointed or tapered silicon structures, such as sharp silicon field emitters, with substantially uniform sharpness, and without introducing additional crystalline defects therein is also needed.

BRIEF SUMMARY OF THE INVENTION

The method of the present invention addresses each of the foregoing needs.

A first embodiment of the method of the present invention comprises sharpening a tapered or pointed silicon structure, such as a silicon field emitter of an existing field emission display. Sharpening a tapered or pointed silicon structure, such as a silicon field emitter, includes oxidizing an exposed surface of same at a relatively low, even extremely low, temperature and removing the oxide layer. The oxidization of the exposed surfaces of the silicon structure and the subsequent removal of the oxide layer therefrom may be repeated to further sharpen the silicon structure.

The tapered or pointed silicon structure, such as a silicon field emitter, may be oxidized at a temperature that will not damage any circuit traces or other metal layers or structures that are associated with the substrate upon which the field emitter is located. Thus, oxidation preferably occurs at a temperature that is less than the melting point of each of the metal structures that are associated with the substrate. An exemplary oxidation temperature is room temperature, which is typically in the range of about 22° C. to about 27° C.

Oxidation processes which have relatively large process windows may be employed in the first embodiment of the inventive method. Such oxidation processes facilitate the formation of a relatively thin oxide layer, such as on the order of tens of angstroms, on the field emitter.

The oxide layer formed on the silicon structure (e.g., field emitter) is removed by etching techniques that are known in the art. Preferably, an etching technique which removes silicon oxide from a silicon substrate without substantially etching the silicon substrate (i.e., a process which utilizes an etchant that is selective for silicon oxide over silicon) is employed to remove the oxide layer from the silicon field emitter.

A second embodiment of the method of the present invention comprises a method of fabricating a tapered silicon structure, such as a field emitter of a field emission display device. The second embodiment is particularly useful for defining tapered silicon structures from a silicon layer of a silicon-on-glass substrate. The second embodiment of the inventive method includes patterning a silicon layer to define a rough silicon structure therefrom, oxidizing the rough silicon structure to form a first oxide layer thereon at a low temperature, re-etching the oxide layer to define a silicon structure, oxidizing the exposed surface of the silicon structure at a low temperature to form a second oxide layer thereon, and removing the second oxide layer to define a finished silicon structure. Low temperature oxidation and re-etching may be repeated in order to form a sharper taper.

Techniques that are known in the art, such as mask and etch processes, may be employed to pattern the silicon layer in order to define the rough silicon structure. Subsequent oxidation and re-etching of the rough silicon structure may also be performed by techniques that are known in the art.

Preferably, low temperature oxidation of the silicon structure forms a relatively thin oxide layer on the exposed surfaces thereof, on the order of tens of angstroms. Thus, the low temperature oxidation techniques that are useful in the inventive method have relatively large process windows, which allow for precise control over the thickness of the second oxide layer that is formed on the silicon structure, relative to the process windows of conventional thermal oxidation processes.

The second oxide layer is removed from the finished structure by etching techniques that are known in the art. Preferably, an etching technique which removes silicon oxide from a silicon substrate without substantially etching the silicon substrate (i.e., a process which utilizes an etchant that is selective for silicon oxide over silicon) is employed to remove the oxide layer from the silicon structure in order to define the finished silicon structure.

Other advantages of the present invention will become apparent through a consideration of the ensuing description of the invention, the accompanying drawings, and the appended claims.

DETAILED DESCRIPTION OF THE INVENTION

Figure 2:
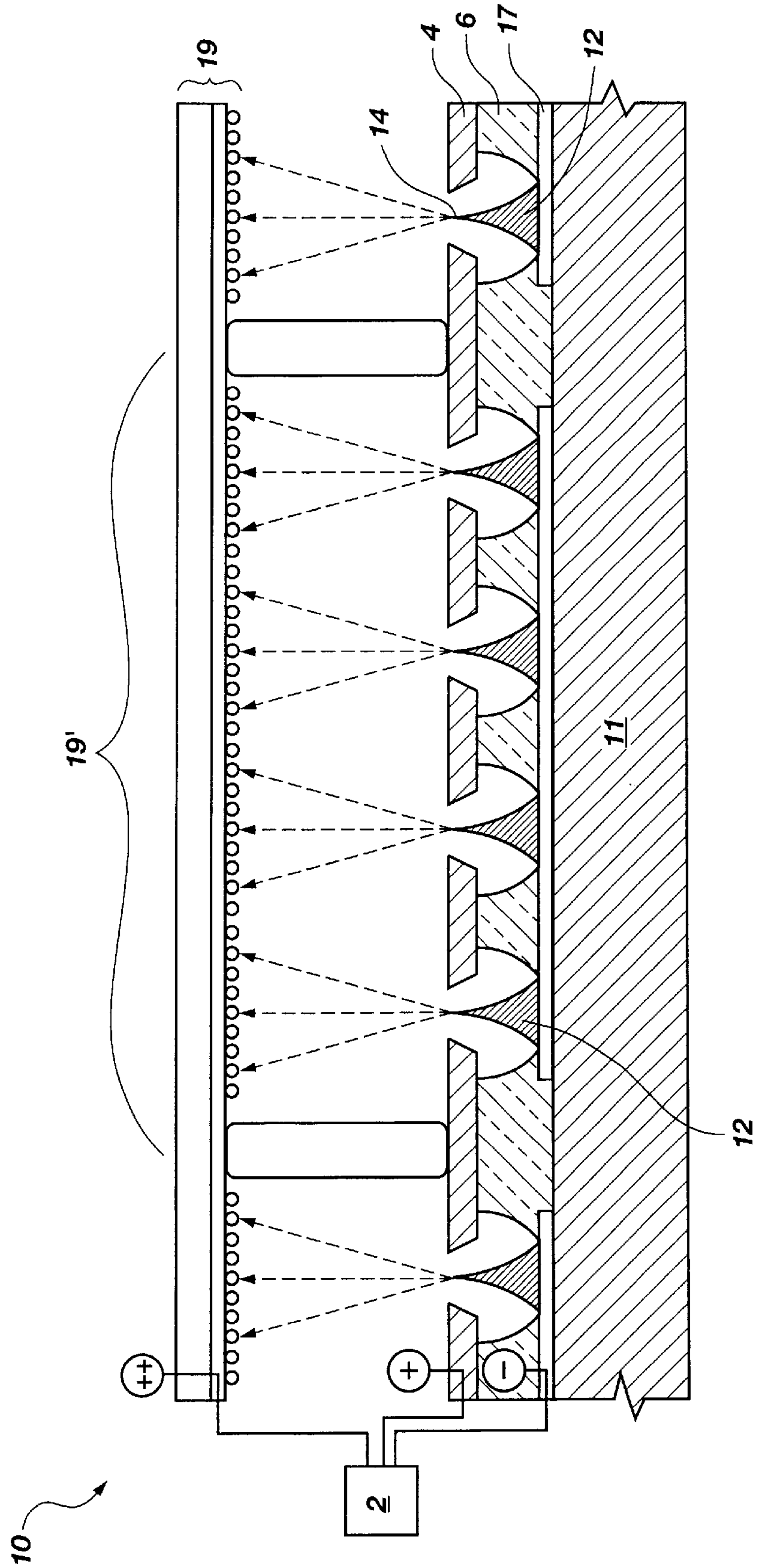
Fig. 2 (PRIOR ART)
FIG. 2 is a schematic representation of a field emission display array.

FIG. 2 schematically depicts a field emission display device 10, which includes a plurality of field emitters 12, which are cathodes, extending upwardly from a substrate 11.

A gate 4, or grid, which is a low potential anode structure, surrounds field emitters 12 in a grid-like fashion, and is separated from the field emitters by openings therethrough and an insulative layer 6. Preferably, field emitters 12 each have a generally conical or pyramidal shape, which defines a tip 14 at the top thereof. Electrical traces 17 contact each field emitter 12 to facilitate the flow of an operational voltage from a source 2 thereto (e.g., 3.3 V or 5 V).

In operation of field emission display device 10, a voltage differential may be applied between one or more field emitters 12 and gate 4. The voltage differential between field emitter 12 and gate 4 causes the field emitter 12 to emit electrons to a phosphor-coated display screen 19, as known in the art, which is an anode, in order to illuminate an area, which is typically referred to as a pixel 19', of the display screen.

Figure 3A:
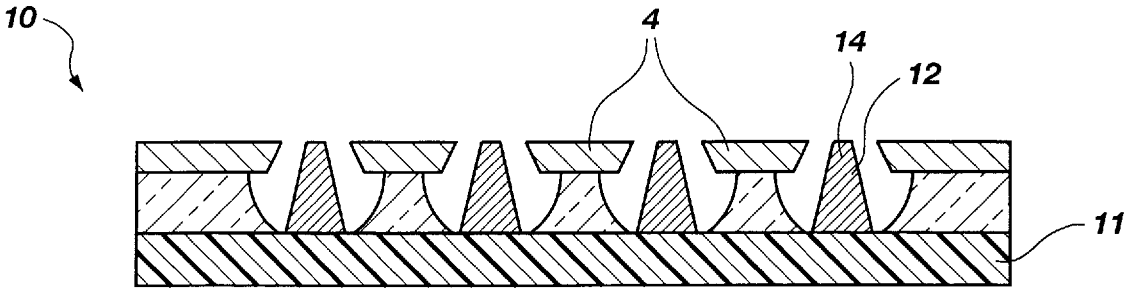
FIGS. 3*a* through 3*c* schematically illustrate a method of sharpening a tapered or pointed silicon structure according to the present invention.
Figure 3B:
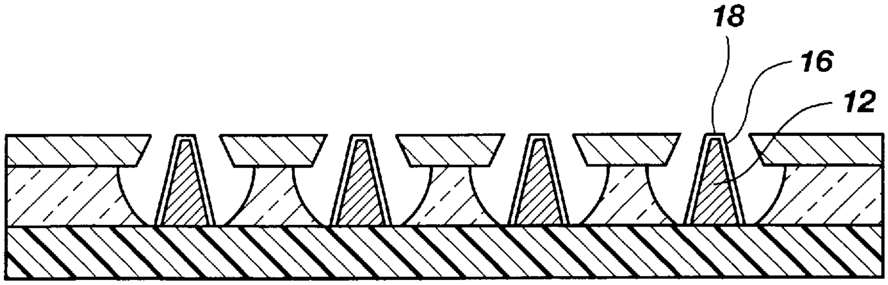
Figure 3C:
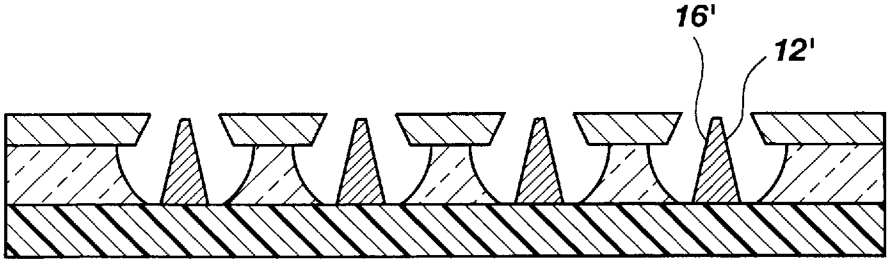

With reference to FIGS. 3*a* through 3*c*, a method of sharpening a silicon field emitter 12 of an existing field emission display device 10 is illustrated. FIG. 3*a* shows a plurality of silicon field emitters 12, which are also referred to as silicon structures, that include blunt emission tips 14. Because emission tips 14 are blunt, silicon field emitter 12 may require a voltage that exceeds a desired functional voltage range, which is also referred to as an "expecting voltage" range, in order to properly emit electrons. As those of skill in the art are aware, sharp emission tips typically have lower voltage requirements than blunt emission tips 14. Thus, by sharpening emission tips 14, the amount of voltage that is required by silicon field emitter 12 to properly emit electrons is decreased.

Field emitters 12 are typically fabricated on a substrate 11 of amorphous silicon, or from single crystalline silicon on a glass substrate (i.e., in a silicon-on-glass (SOG) configuration).

As an existing field emission display device includes a gate 4 and circuitry (not shown), the gate or circuitry may be damaged by the use of thermal oxidation processes to sharpen emission tips 14. Thus, a relatively low temperature oxidation process is desirable to sharpen emission tips 14.

Referring now to FIG. 3*b*, a surface 16 of each silicon field emitter 12 is oxidized at low temperature in order to form an oxide layer 18 thereon. Silicon field emitters 12 are preferably oxidized at a temperature (e.g., room temperature—about 22° C. to about 27° C.) that will not damage any circuit traces 17 or other metal layers or structures that are associated with the field emission display device 10 of which the silicon field emitter 12 is a part. In addition, low temperature oxidation techniques that are useful in the inventive sharpening method may be employed without causing significant damage to substrates such as silicon-on-glass.

An exemplary low temperature oxidation technique that is useful in the inventive method includes exposing surface 16 of each field emitter 12 to an oxidant which includes hydrogen peroxide ($H_2O_2$). Preferably, the oxidant includes at least about 20% $H_2O_2$ by volume. When surface 16 of each silicon field emitter 12 is exposed to a hydrogen peroxide solution at 40° C. for about 30 seconds, an oxide layer 18 having a thickness of about 20 Å to about 40 Å is formed on silicon field emitters 12.

Alternative low temperature oxidants that may be used in the sharpening method include, without limitation, ozonized, purified water (e.g., including at least about 2 p.p.m. ozone ($O_3$)); a 1:20:100 (v/v/v) solution of ammonium hydroxide ($NH_4OH$), $H_2O_2$ and water, which is also referred to as "SC-1" or "APM"; a 4:1 (v/v) solution of sulfuric acid ($H_2SO_4$) and $H_2O_2$, which is also referred to as "SEPTUM"; and a 1:1:6 (v/v/v) solution of hydrochloric acid (HCl), $H_2O_2$ and water, which is also referred to as "HPM". Exemplary oxidation techniques in which these oxidants may be employed and the thicknesses of the oxide layers formed thereby are disclosed in Takeshi Ohwaki et al., *Characterization of Silicon Native Oxide Formed in SC-1, $H_2O_2$ and Wet Ozone Processes,* 36 Jpn. J. Applied Phys. 5507 (1997); T. Ohmi et al., *Native Oxide Growth and Organic Impurity Removal on Si Surface with Ozone-Injected Ultrapure Water,* 140 J. Electrochem. Soc. 804 (1993); and Tadahiro Ohmi, *Very high quality thin gate oxide formation technology,* 13 J. Vac. Sci. Technol. A 1665 (1995), the disclosures of each of which are hereby incorporated by reference in their entirety.

FIG. 3*c* depicts the removal of oxide layer 18 from each of the silicon field emitters 12 (see FIGS. 3*a* and 3*b*) to define sharpened field emitters 12', which are also referred to as sharpened silicon structures. Oxide layer 18 may be removed by techniques that are known in the art, such as by the use of etchants. Preferably, the technique that is employed to remove oxide layer 18 from silicon field emitters 12 selectively removes silicon oxide without substantially affecting the underlying silicon. Hydrofluoric acid (HF) is an exemplary wet etchant that selectively attacks silicon oxide over silicon. The use of a dilute (e.g., 2%, by volume) HF solution at 25° C. for about 40 seconds is sufficient to remove an oxide layer 18 of about 20 Å to about 40 Å thick from silicon field emitters 12.

Other selective wet etchants that may be employed in the inventive method may include HF and a buffer, such as $NH_4F$.

The oxidization of surface 16' of sharpened field emitters 12' and the subsequent removal of the oxide layer therefrom may be repeated to further sharpen the silicon field emitters. Such repetition may be required to sharpen silicon field emitters 12 that fail to turn "on" during testing, or to sharpen silicon field emitters that require a voltage which significantly exceeds the expecting voltage range in order to turn "on" when tested. The sharpening method of the present invention may be employed to sharpen emitter tips 14 (see FIG. 3*a*) of field emitters 12 from a diameter of as much as about 1000 Å to a diameter as small as about 40 Å to 20 Å, or less.

Figure 4A:
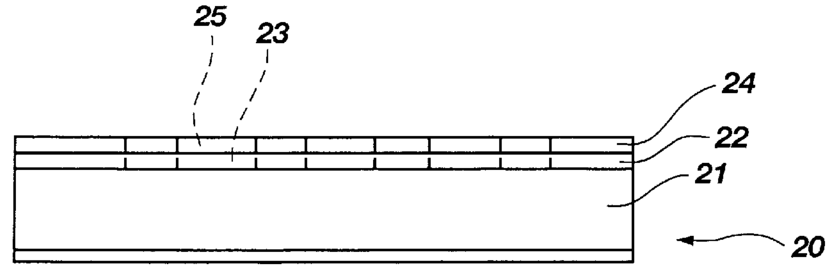
FIGS. 4*a* through 4*f* schematically illustrate a method of fabricating a tapered or pointed silicon structure according to the present invention.

Turning now to FIGS. 4*a* through 4*f*, another embodiment of the method of the present invention, a method of fabricating a tapered or pointed silicon structure, is illustrated and described. The present embodiment is particularly useful for fabricating silicon field emitter tips on substrates, such as silicon-on-glass, that may not withstand the high temperatures of conventional thermal oxidation processes. FIG. 4*a* illustrates a silicon-on-glass substrate 20 from which tapered or pointed silicon structures, such as finished field emitters 34 (see FIG. 4*f*), are fabricated. Silicon substrate 20 is patterned by techniques that are known in the art, such as mask and etch techniques, in order to form a rough silicon structure, such as rough field emitters 30. Rough field emitters 30 are each oxidized by a low temperature oxidation technique to form a first oxide layer 31 thereon, and the oxide layer is removed to define silicon field emitters 32, which are also referred to as silicon structures. A second oxide layer 33 may be formed on each silicon field emitter 32 by a low temperature oxidation technique, and removed therefrom. The low temperature oxidation process may be repeated as necessary to define finished field emitters 34, which are also referred to as finished silicon structures, having tips 35 (see FIG. 4*f*) of a desired sharpness.

FIG. 4*a* shows a mask layer 22, such as silicon oxide or silicon nitride, disposed over a surface of silicon-on-glass substrate 20, and a resist layer 24 disposed over mask layer 22. Mask layer 22 may be fabricated by methods and from materials that are known in the art, such as silicon oxide or silicon nitride and methods of depositing them. Resist layer 24 is patterned (e.g., by electromagnetic radiation) to define one or more openings 25 therethrough. Mask layer 22 is then exposed to an etchant, as known in the art, to define one or more openings 23 therethrough. An exemplary etchant that may be used to pattern a silicon oxide mask layer 22 comprises a mixture of carbon tetrafluoride and hydrogen, which may be employed in a plasma etch technique. An exemplary dry etchant that may be used to pattern a silicon nitride mask layer 22 comprises a mixture of carbon tetrafluoride and oxygen. The remnants of resist layer 24 may then be removed from mask layer 22, as known in the art.

Figure 4B:
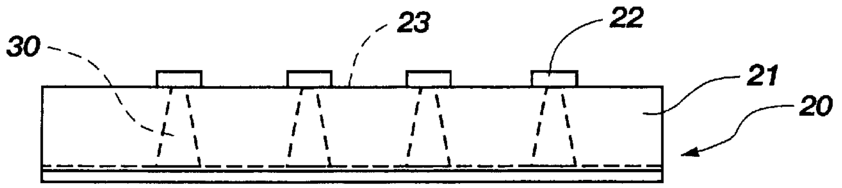

With reference to FIG. 4*b*, areas of silicon layer 21 that are exposed through openings 23 are patterned to define rough silicon structures, such as rough field emitters 30, therefrom. Known silicon etching techniques and etchants, including, without limitation, wet etch and dry etch techniques that isotropically or anisotropically selectively etch silicon over silicon oxide or silicon nitride are useful for patterning the rough silicon structure. Anisotropic etch techniques would likely form structures with higher aspect ratios. An exemplary wet etchant that may be employed to pattern the rough silicon structures comprises a mixture of nitric acid and hydrofluoric acid.

Mask layer 22 may then be removed from silicon-on-glass substrate 20 by known techniques, or lifted from the substrate during subsequent etching of an oxide layer from the tapered silicon structure.

Figure 4C:
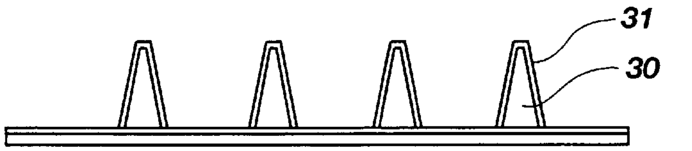

FIG. 4*c* illustrates the formation of a first oxide layer 31 on an exposed surface of rough field emitter 30 by exposing rough field emitter 30 to an oxidant which includes hydrogen peroxide ($H_2O_2$). Preferably, the oxidant includes at least about 20% $H_2O_2$ by volume. When the surface of rough field emitter 30 is exposed to a hydrogen peroxide solution at 40° C. for about 30 seconds, the oxide layer 33 that is formed thereon has a thickness of about 20 Å to about 40 Å.

The alternative low temperature oxidants that are useful in the above-described sharpening method of FIGS. 3*a* through 3*c* may also be employed in the inventive tapered silicon structure fabrication method.

Figure 4D:
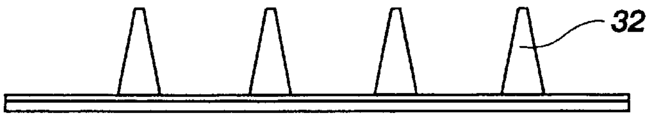

Referring now to FIG. 4*d*, oxide layer 31 may be removed from rough field emitter 30 (see FIG. 4*b*) to define silicon field emitter 32. Oxide layer 31 may be removed by silicon oxide etch techniques that are known in the art. Preferably, the technique that is employed to remove oxide layer 31 from rough field emitter 30 selectively removes silicon oxide without substantially affecting the underlying silicon.

Figure 4E:
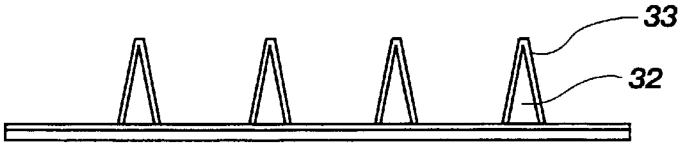
Figure 4F:
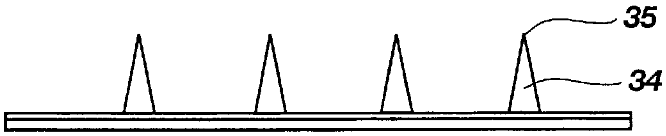

Silicon field emitter 32 is then sharpened, as shown in FIGS. 4*e* and 4*f*. Referring to FIG. 4*e*, an exposed surface of silicon field emitter 32 is oxidized at low temperature in order to form oxide layer 33 thereon. Preferably, low temperature oxidation techniques that are useful in the inventive sharpening method have relatively large process windows, which facilitates the formation of a relatively thin oxide layer 33 (e.g., about 20 Å to about 40 Å) on silicon field emitter 32.

An exemplary low temperature oxidation technique that is useful in the inventive tapered structure fabrication method includes exposing silicon field emitter 32 to an oxidant which includes hydrogen peroxide ($H_2O_2$). Preferably, the oxidant includes at least about 20% $H_2O_2$ by volume. When the surface of silicon field emitter 32 is exposed to a hydrogen peroxide solution at 40° C. for about 30 seconds, the oxide layer 33 that is formed thereon has a thickness of about 20 Å to about 40 Å.

The alternative low temperature oxidants that are useful in the above-described sharpening method of FIGS. 3*a* through 3*c* may also be employed in the inventive tapered silicon structure fabrication method.

FIG. 4*f* depicts the removal of oxide layer 33 from the silicon field emitter 32 (see FIGS. 4*d* and 4*e*) to define finished field emitter 34. Techniques that are known in the art, such as the use of etchants, may be employed to remove oxide layer 33 from silicon field emitter 32. Preferably, the technique that is employed to remove oxide layer 33 from silicon field emitter 32 selectively removes silicon oxide without substantially affecting the underlying silicon of the field emitter. Hydrofluoric acid (HF) is an exemplary wet etchant that selectively attacks silicon oxide over silicon. The use of a dilute (e.g., 2%) HF solution at 25° C. for about 40 seconds is sufficient to remove an oxide layer 33 of up to about 20 Å to about 40 Å thick.

Alternatively, other selective wet etchants or selective dry etching techniques that are known in the art may also be employed to remove oxide layer 33 from silicon field emitter 32. Other selective wet etchants that may be employed in the inventive method may include HF and a buffer, such as $NH_4F$. Exemplary dry etchants that selectively etch silicon oxides over silicon include, without limitation, $CF_4+H_2$ ($\geqq$40%) plasmas and other fluorocarbon-containing fluorine-deficient plasmas known in the art.

Oxidizing the surface of finished field emitter 34 to form an oxide layer thereon, and the subsequent removal of the oxide layer therefrom, may be repeated one or more times to further sharpen finished field emitter 34. The fabrication method of the present invention may be employed to fabricate tapered or pointed silicon structures, such as finished field emitters 34, which include a tip 35 that is from about 40 Å to 20 Å or less in width or diameter.

The embodiment illustrated in FIGS. 4*a*–4*f* may also be employed to fabricate other tapered or pointed silicon structures on substrates such as silicon-on-glass. The present embodiment of the inventive process may also be employed to increase product yield in fabricating tapered silicon structures, such as field emitters, on a silicon substrate.

Figure 1:
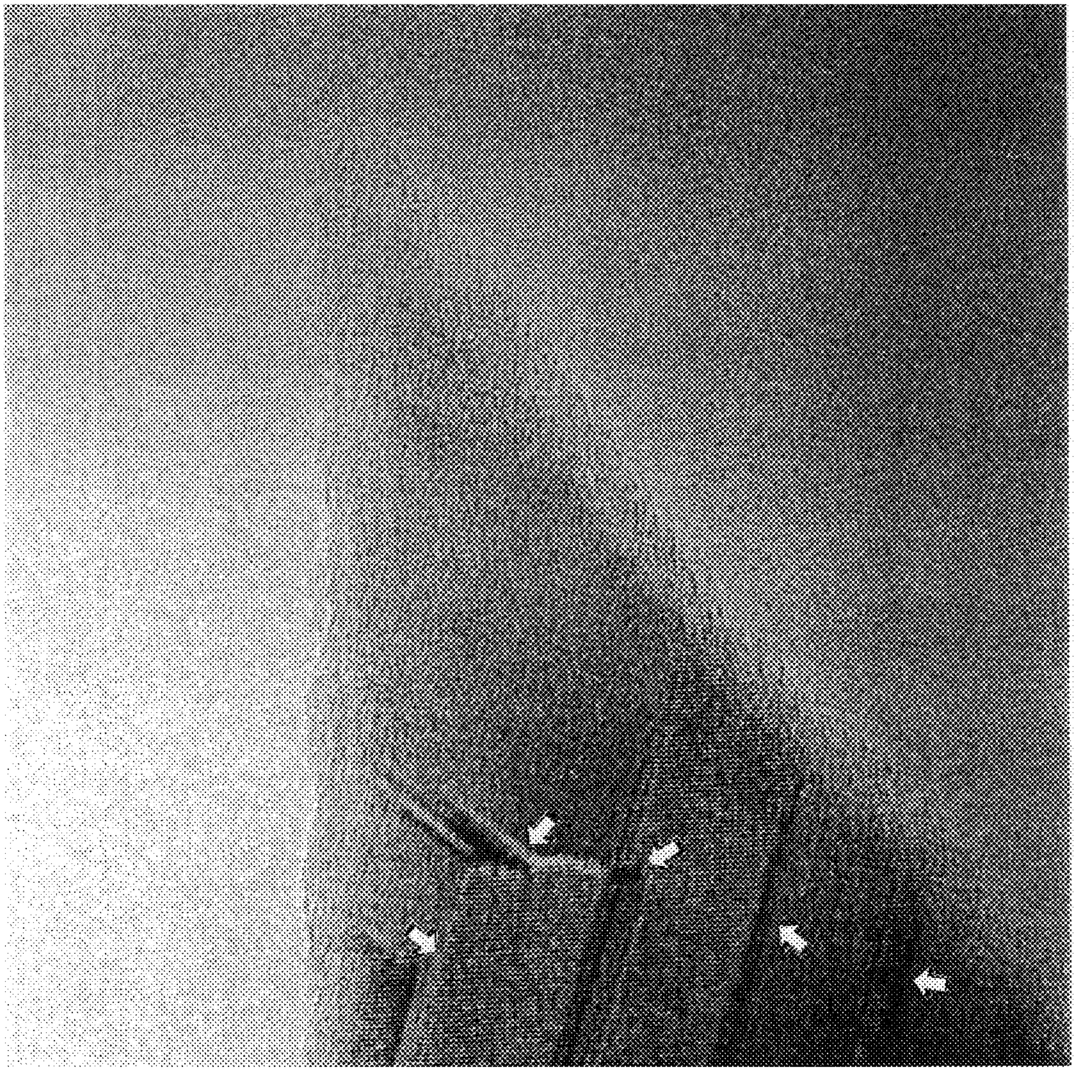
Fig. 1 (PRIOR ART)
FIG. 1 is a transmission electron micrograph of a field emitter that was fabricated and sharpened by conventional processes, and which includes crystalline defects from repeated thermal oxidation.
Figure 5:
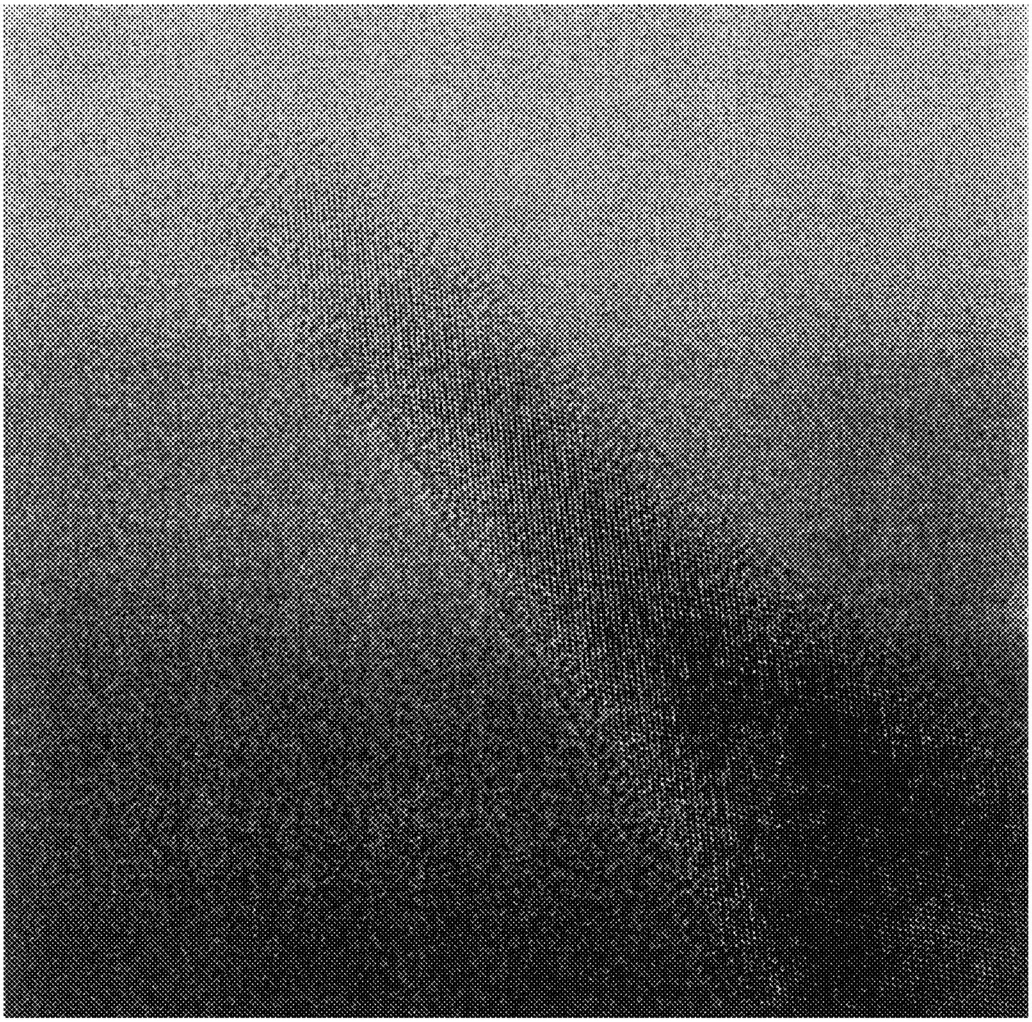
Fig. 5 (PRIOR ART)
FIG. 5 is a transmission electron micrograph of a field emitter that was sharpened in accordance with the process that is illustrated in FIGS. 3*a* through 3*c*.

FIG. 5 illustrates the silicon lattice structure of a silicon structure, such as a silicon field emitter, that has been sharpened in accordance with the sharpening method of the present invention. When compared to the electron micrograph of FIG. 1, FIG. 5 illustrates that the sharpening method of the present invention reduces or eliminates the incidence of crystalline defects in the sharpened silicon structure.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of this invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A method for fabricating a sharpened silicon structure, comprising:

patterning a silicon-on-glass substrate to define a rough silicon structure;

oxidizing a surface of said rough silicon structure to form a first oxide layer thereon;

removing said first oxide layer from said rough silicon structure to define a silicon structure;

oxidizing a surface of said silicon structure at a temperature of about 100° C. or less to form a second oxide layer thereon; and removing said second oxide layer from said silicon structure to define said sharpened silicon structure.

2. The method of claim 1, wherein said oxidizing said surface of said rough silicon structure comprises thermally oxidizing said surface.

3. The method of claim 1, wherein said oxidizing said surface of said silicon structure comprises exposing said surface to hydrogen peroxide, ammonium hydroxide, sulfuric acid, or hydrochloric acid.

4. The method of claim 1, wherein said removing said first oxide layer comprises etching said first oxide layer.

5. The method of claim 4, wherein said etching said first oxide layer comprises exposing said first oxide layer to hydrofluoric acid.

6. The method of claim 1, wherein said removing said second oxide layer comprises etching said second oxide layer.

7. The method of claim 6, wherein said etching said second oxide layer comprises exposing said second oxide layer to hydrofluoric acid.

8. A method for fabricating a sharpened silicon structure, comprising:

patterning a substrate comprising silicon to define a rough silicon structure;

oxidizing a surface of said rough silicon structure to form a first oxide layer thereon;

removing said first oxide layer from said rough silicon structure to define a silicon structure;

oxidizing a surface of said silicon structure at a temperature of about 100° C. or less to form a second oxide layer thereon; and removing said second oxide layer from said silicon structure to define said sharpened silicon structure.

9. The method of claim 8, wherein said oxidizing said surface of said rough silicon structure comprises thermally oxidizing said surface.

10. The method of claim 8, wherein said oxidizing said surface of said silicon structure comprises exposing said surface to hydrogen peroxide, ammonium hydroxide, sulfuric acid, or hydrochloric acid.

11. The method of claim 8, wherein said removing said first oxide layer comprises etching said first oxide layer.

12. The method of claim 11, wherein said etching said first oxide layer comprises exposing said first oxide layer to hydrofluoric acid.

13. The method of claim 8, wherein said removing said second oxide layer comprises etching said second oxide layer.

14. The method of claim 13, wherein said etching said second oxide layer comprises exposing said second oxide layer to hydrofluoric acid.

15. A method for fabricating a plurality of finished field emitters, comprising:

patterning a silicon-on-glass substrate to define a plurality of rough field emitters;

oxidizing a surface of each of said plurality of rough field emitters to form a first oxide layer thereon;

removing said first oxide layer from each of said plurality of rough field emitters to define a plurality of silicon field emitters;

oxidizing a surface of each of said plurality of silicon field emitters at a temperature of about 100° C. or less to form a second oxide layer thereon; and removing said second oxide layer from each of said plurality of silicon field emitters to define the plurality of finished field emitters.

16. The method of claim 15, wherein said oxidizing said surface of each of said plurality of rough field emitters comprises thermally oxidizing said surface.

17. The method of claim 15, wherein said oxidizing said surface of each of said plurality of silicon field emitters comprises exposing said surface to hydrogen peroxide, ammonium hydroxide, sulfuric acid, or hydrochloric acid.

18. The method of claim 15, wherein said removing said first oxide layer comprises etching said first oxide layer.

19. The method of claim 18, wherein said etching said first oxide layer comprises exposing said first oxide layer to hydrofluoric acid.

20. The method of claim 15, wherein said removing said second oxide layer comprises etching said second oxide layer.

21. The method of claim 20, wherein said etching said second oxide layer comprises exposing said second oxide layer to hydrofluoric acid.

22. A method for fabricating a plurality of finished field emitters, comprising:

patterning a substrate comprising silicon to define a plurality of rough field emitters;

oxidizing a surface of each of said plurality of rough field emitters to form a first oxide layer thereon;

removing said first oxide layer from each of said plurality of rough field emitters to define a plurality of silicon field emitters;

oxidizing a surface of each of said plurality of silicon field emitters at a temperature of about 100° C. or less to form a second oxide layer thereon; and removing said second oxide layer from each of said plurality of silicon field emitters to define the plurality of finished field emitters.

23. The method of claim 22, wherein said oxidizing said surface of each of said plurality of rough field emitters comprises thermally oxidizing said surface.

24. The method of claim 22, wherein said oxidizing said surface of each of said plurality of silicon field emitters comprises exposing said surface to hydrogen peroxide, ammonium hydroxide, sulfuric acid, or hydrochloric acid.

25. The method of claim 22, wherein said removing said first oxide layer comprises etching said first oxide layer.

26. The method of claim 25, wherein said etching said first oxide layer comprises exposing said first oxide layer to hydrofluoric acid.

27. The method of claim 22, wherein said removing said second oxide layer comprises etching said second oxide layer.

28. The method of claim 27, wherein said etching said second oxide layer comprises exposing said second oxide layer to hydrofluoric acid.

* * * * *

UNITED STATES PATENT AND TRADEMARK OFFICE

CERTIFICATE OF CORRECTION

PATENT NO. : 6,440,762 B1 Page 1 of 1
DATED : August 27, 2002
INVENTOR(S) : Tianhong Zhang It is certified that error appears in the above-identified patent and that said Letters Patent is hereby corrected as shown below:

Title page,
Item [56], References Cited, U.S. PATENT DOCUMENTS, change “5,201,993” to -- 5,201,992 --

Column 1,
Line 9, insert a comma after “pending”

Column 3,
Line 10, change “silicon-onglass” to -- silicon-on-glass --

Signed and Sealed this

Fifth Day of August, 2003

JAMES E. ROGAN
*Director of the United States Patent and Trademark Office*